United States Patent
Meltzer (10) Patent No.: US 7,355,482 B2
(45) Date of Patent: Apr. 8, 2008

(54) METHODS AND APPARATUS FOR COMPENSATING A VARIABLE OSCILLATOR FOR PROCESS, VOLTAGE, AND TEMPERATURE VARIATIONS USING A REPLICA OSCILLATOR

(75) Inventor: David Meltzer, Wappinger Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 112 days.

(21) Appl. No.: 11/356,751

(22) Filed: Feb. 17, 2006

(65) Prior Publication Data
US 2007/0200635 A1  Aug. 30, 2007

(51) Int. Cl.
*H03L 7/00* (2006.01)

(52) U.S. Cl. .............. 331/2; 331/10; 331/16; 331/47; 331/176

(58) Field of Classification Search .......... 331/2, 331/10, 11, 16, 17, 18, 46, 47, 57, 34, 66, 331/175, 186
See application file for complete search history.

(56) References Cited

U.S. PATENT DOCUMENTS

| | | | |
|---|---|---|---|
| 3,931,588 A * | 1/1976 | Gehweiler | ............ 331/57 |
| 4,829,258 A | 5/1989 | Volk et al. | |
| 5,061,907 A | 10/1991 | Rasmussen | |
| 5,168,245 A | 12/1992 | Koskowich | |
| 5,233,314 A * | 8/1993 | McDermott et al. | ......... 331/17 |
| 5,331,295 A | 7/1994 | Jelinek et al. | |
| 5,748,044 A | 5/1998 | Xue | |
| 5,900,784 A | 5/1999 | O'Sullivan | |
| 5,936,476 A | 8/1999 | Iravani | |
| 6,150,887 A * | 11/2000 | Yamaguchi | .................. 331/11 |
| 6,456,166 B2 | 9/2002 | Yabe | |
| 6,667,663 B2 * | 12/2003 | Ozawa | ........................ 331/17 |
| 6,680,655 B2 | 1/2004 | Rogers | |
| 6,803,829 B2 | 10/2004 | Duncan et al. | |
| 2003/0184390 A1 * | 10/2003 | Lin et al. | ..................... 331/57 |

* cited by examiner

Primary Examiner—Robert J. Pascal
Assistant Examiner—Ryan J Johnson (57) ABSTRACT

Circuits and methods for compensating a variable oscillator for process and/or operational variations. The circuit generally comprises (a) a replica oscillator, (b) a counter configured to count pulses of the replica oscillator and to produce a count signal, and (c) a compensation circuit configured to provide an adjustment signal to the variable oscillator in accordance with the count signal. The method generally comprises the steps of (a) counting the number of pulses of a replica oscillator signal, and (b) providing an adjustment signal to the variable oscillator in accordance with the number of pulses counted. The present invention advantageously provides a largely digital method to compensate a variable oscillator for process, voltage, and temperature variations.

18 Claims, 9 Drawing Sheets

METHODS AND APPARATUS FOR COMPENSATING A VARIABLE OSCILLATOR FOR PROCESS, VOLTAGE, AND TEMPERATURE VARIATIONS USING A REPLICA OSCILLATOR

FIELD OF THE INVENTION

The present invention generally relates to the field of high frequency variable oscillators, particularly to variable oscillators in phase locked loops. More specifically, embodiments of the present invention pertain to circuits and methods for maintaining a desirable oscillation frequency range in the presence of manufacturing process variations as well as variations in operating voltage and temperature.

DISCUSSION OF THE BACKGROUND

Figure 1:
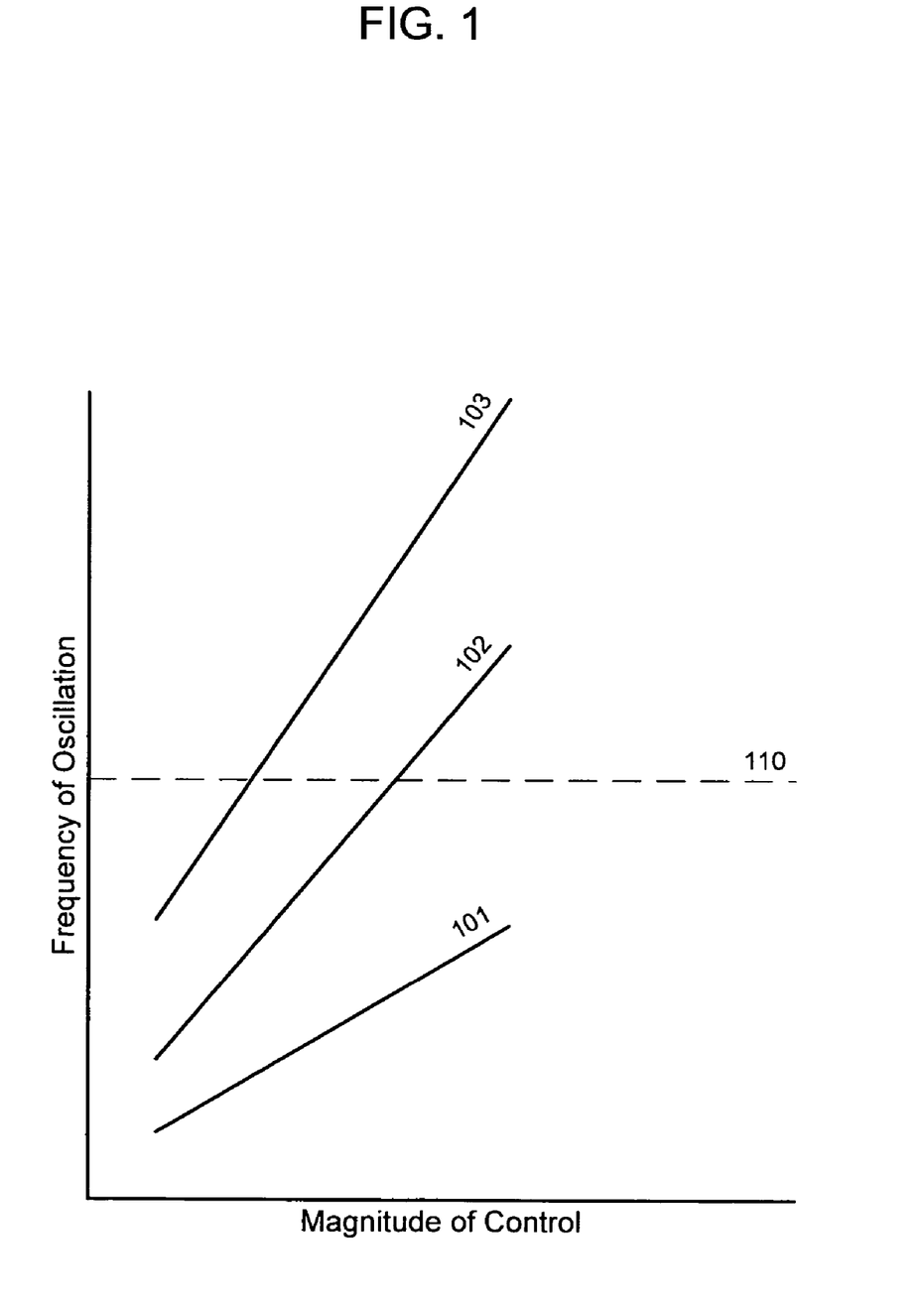
FIG. 1 is a graph showing gain curves for a hypothetical variable oscillator over process variations.

A variable frequency oscillator (VFO) generally produces an oscillating signal with a frequency that may be controlled by an external control. The control signal may generally comprise a variable voltage (for a voltage controlled oscillator [VCO]), a variable current, or a numeric digital value (for a digital or numerically controlled oscillator [NCO]). VFOs generally have characteristic gain curves such as those shown in FIG. 1. This gain curve relates the frequency of oscillation to the input control amplitude. FIG. 1 shows gain curves for a hypothetical oscillator over three different manufacturing process runs. For CMOS processes, manufacturing variations occur in a wide variety of parameters but the most important, from the viewpoint of circuit operation, are transistor threshold, transconductance, and parasitic capacitance. The three curves of FIG. 1 represent fast, typical and slow process versions of the same oscillator design. A slow process corner (e.g., a process resulting in a VFO with gain curve 101) may have high threshold transistors of low transconductance ($g_m$) and high parasitic capacitance. Gain curve 102 represents a nominal center of the manufacturing process. A fast process corner (e.g., a process resulting in a VFO with gain curve 103) may have transistors of low threshold, high $g_m$, and low parasitic capacitance.

FIG. 1 shows that an oscillator may have unacceptable frequency output characteristics under some process variations. Frequency 110 represents the target frequency for a hypothetical application of an oscillator. FIG. 1 shows that an oscillator with slow gain curve 101 cannot attain nominal center frequency 110, because no point on slow gain curve 101 intersects the target frequency. Thus, for this hypothetical application, chips manufactured at a slow process corner generally cannot be used.

Figure 2:
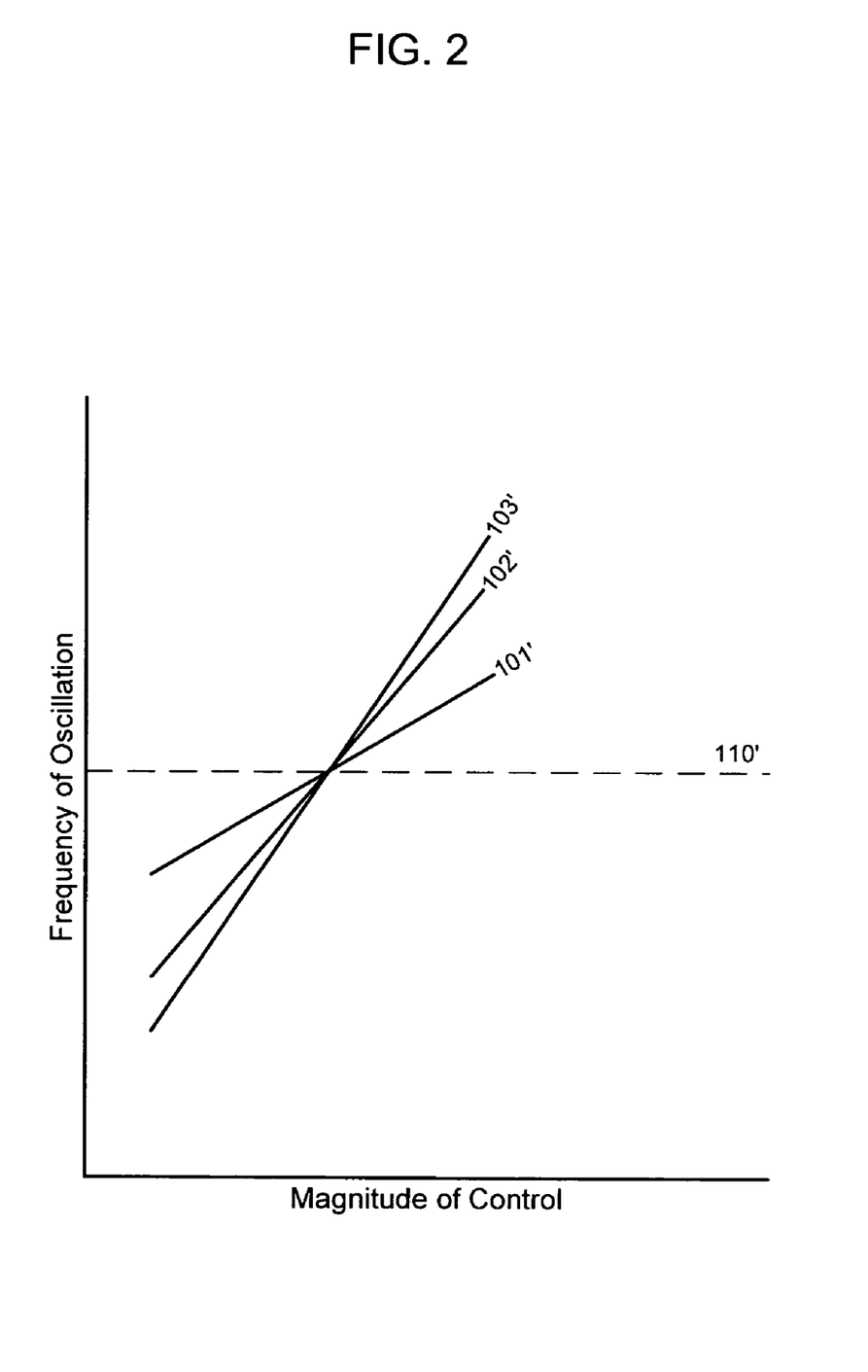
FIG. 2 is a graph showing desired gain curves for a hypothetical variable oscillator over process variations.

FIG. 2 shows a more desirable set of gain curves (101', 102', 103') for a hypothetical oscillator which is usable under all manufacturing process variations. In such a hypothetical oscillator, nominal center frequency 110' may be similar for all 3 curves, such that only the slope (gain) changes. Generally when such an oscillator is used in a phase locked loop, the lowest jitter and highest stability may be obtained with the minimum gain slope for the application.

Similar curves can be generated for voltage and temperature variations. Variations in voltage generally change the magnitude of the range control signal as well as the gain slope. Temperature variations generally change both the slope and center frequency. While process variations are generally constant for a given chip, voltage and temperature variations may change over time. Therefore, it is desirable to produce a variable frequency oscillator which can compensate for process, voltage, and temperature (PVT) variations.

The problem of process and voltage variation particularly applies to ring oscillators. VFOs which contain tuned resonators (e.g., inductors, crystals, SAW resonators, etc.) generally do not vary as much in frequency over voltage and process variations. Temperature compensation for such oscillators is generally handled using circuitry specific to the type of resonator.

Many conventional ring oscillators use an internal current to control the frequency of oscillation. Stages of these oscillators may include current starved inverters or current switch buffers. Conventional approaches to compensating for process and operational variations in such ring oscillators typically use analog techniques.

For example, one conventional approach achieves the process compensation by using an analog measurement system which determines the channel strength of the P and N type transistors to generate a current inversely proportional thereto. An additional measurement circuit measures the trip or switching voltage level between the P and N transistors of a dummy ring oscillator stage. The two measurements may be combined to modify the current generated by the control voltage to control the frequency. This method generally does not measure the capacitance variation of the oscillator stages and so may not achieve full compensation for process variations.

Another conventional approach uses an analog means which subtracts a current from an accurate current reference (which is relatively independent of PVT variations) from a tracking current, which generates a difference current having both process-dependent and process-independent current components. This difference current may be generally proportional to the PVT variation and may be used to attenuate the effect of the oscillator control voltage in a manner which lessens the effects of the PVT variation. This method generally requires two analog current references: the process independent reference and the tracking reference. Such analog circuitry, however, generally occupies a relatively large silicon area using conventional CMOS processes.

Yet another conventional approach achieves the desired low gain in the presence of PVT variations by selecting from among a plurality of ring oscillators which oscillate at different frequencies. The oscillator forms part of a PLL system, and the lock/unlock state of the PLL may be used to determine which oscillator is within the correct frequency and gain range.

It can be seen that circuits and methods for compensating the gain and center frequency of a variable oscillator (and particularly a ring oscillator) for variations due to process, voltage, and temperature is desirable. In addition, a digital circuit is preferable to analog for modern CMOS processes where digital logic tends to occupy less die area than analog functions. Furthermore, a reduction in slope of the gain curve (e.g., reduced variation in frequency for equal variation in control signal) is desirable when the variable oscillator is used in phase locked loop applications. The compensation circuits and methods should allow such a reduction in slope while preserving the usability of the variable oscillator for a wide range of PVT variations.

SUMMARY OF THE INVENTION

Embodiments of the present invention relate to circuits and methods for compensating a variable oscillator for process and/or operational variations. The circuit generally comprises (a) a replica oscillator, (b) a counter configured to count pulses of the replica oscillator and to produce a count signal, and (c) a compensation circuit configured to provide an adjustment signal to the variable oscillator in accordance with the count signal. The method generally comprises the steps of (a) counting the number of pulses of a replica oscillator signal, and (b) providing an adjustment signal to the variable oscillator in accordance with the number of pulses counted. The present invention advantageously provides a largely digital method to compensate a variable oscillator for process, voltage, and temperature (PVT.) variations.

One embodiment of the invention generally uses a low frequency reference clock (e.g., a low frequency reference clock of the type often present in complex PALL based systems, such as one produced by a quartz crystal) in conjunction with a low frequency ring oscillator. The low frequency ring oscillator may be on the same chip as the relatively high frequency variable oscillator to measure the variation of frequency with PVT. variations for the current operating conditions. This measurement may occur continually at a regular rate. The results of the measurement may be used to control current setpoints for the biasing of a unique four stage (variable) ring oscillator. This variable oscillator may comprise three compensation inputs, a total current, a feed forward current, and a normal bias current. The oscillator compensation may utilize the principal that the higher the current, the higher the frequency for a given set of PVT. parameters. Therefore, by adjusting the total current as a function of the replica speed (PVT. parameters), the gain curve may be adjusted. The current setpoint values may be analog inputs to the oscillator, while the measurement and determination of the correct values may be purely digital.

These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams, or waveforms within a computer, processor, controller, and/or circuit. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic or other circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations, and/or processes of the processing devices that manipulate or transform physical quantities or signals within the component(s) of a system or architecture (e.g., registers, memories, other such information storage, or transmission devices, waveforms carried on wires or other transmission media, etc.) into other data similarly represented as physical quantities and/or waveforms within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The present invention concerns a circuit configured to compensate a variable oscillator for process and/or operational variations. The circuit generally comprises (a) a replica oscillator, (b) a counter configured to count pulses of the replica oscillator and to produce a count signal, and (c) a compensation circuit configured to provide an adjustment signal to the variable oscillator in accordance with the count signal.

A further aspect of the invention concerns a method for compensating a variable oscillator for process and/or operational variations. The method generally comprises the steps of (a) counting the number of pulses of a replica oscillator signal, and (b) providing an adjustment signal to the variable oscillator in accordance with the number of pulses counted.

The invention, in its various aspects, will be explained in greater detail below with regard to exemplary embodiments.

An Exemplary Circuit

In one aspect, the present invention relates to a circuit configured to compensate a variable oscillator for process and/or operational variations. The circuit generally comprises (a) a replica oscillator, (b) a counter configured to count pulses of the replica oscillator and to produce a count signal, and (c) a compensation circuit configured to provide an adjustment signal to the variable oscillator in accordance with the count signal.

In a preferred embodiment, the variable oscillator and the replica oscillator may be on a single integrated circuit chip. The replica oscillator and the variable oscillator may thereby experience substantially the same manufacturing process variations and substantially the same operational variations (e.g., voltage and temperature variations). Thus, variations in the frequency output of the replica oscillator may mirror similar variations in the frequency response of the variable oscillator.

Figure 3A:
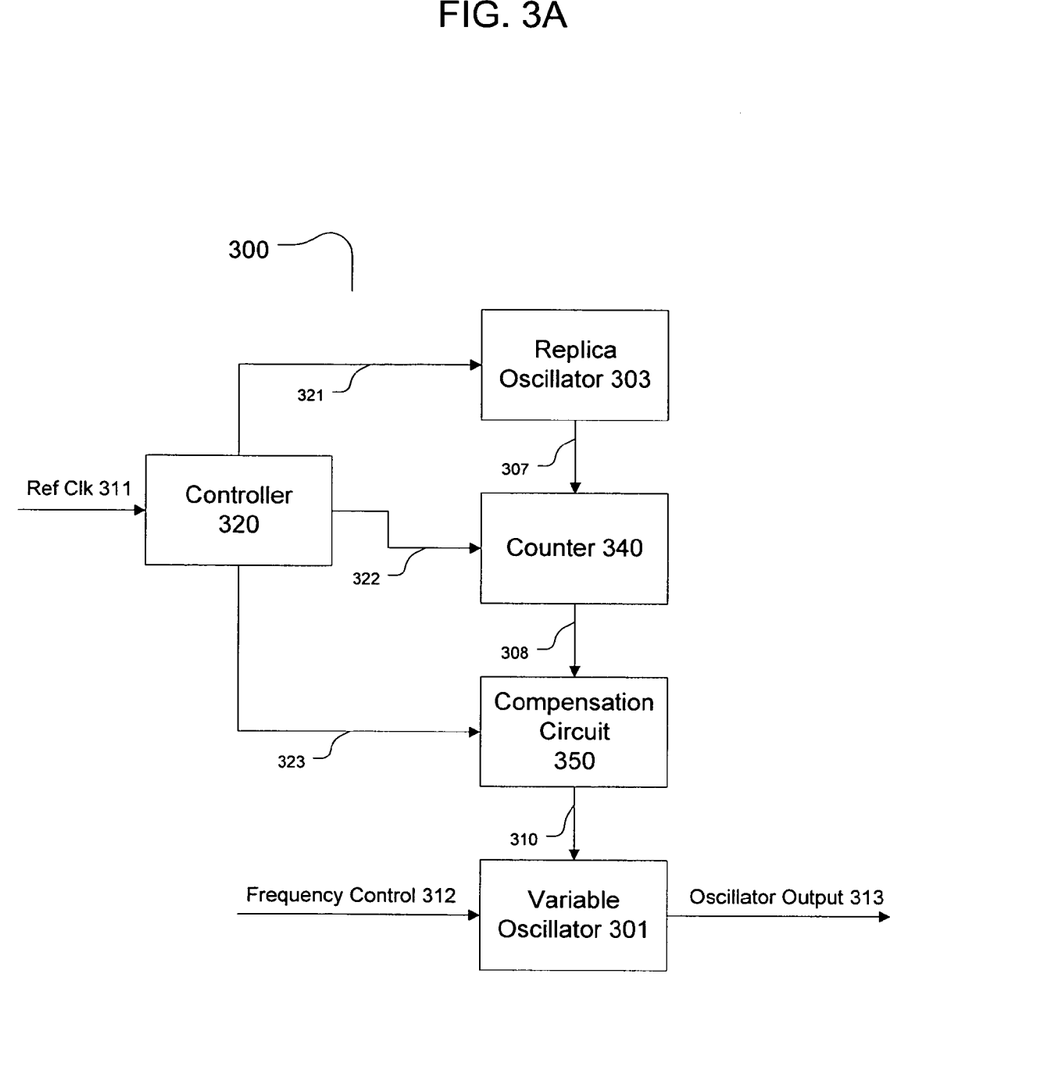
FIGS. 3A/B are block diagrams showing exemplary embodiments of the present invention.

Referring now to FIG. 3A, circuit 300 may comprise replica oscillator 303, configured to produce oscillator signal 307. Counter 340 may count pulses of oscillator signal 307 and produce count signal 308. Compensation circuit 350 may then produce adjustment signal 310 in accordance with count signal 308 (e.g., to produce an appropriate adjustment signal when the count is higher or lower than expected).

In one embodiment, the replica oscillator may comprise a ring oscillator. For example, the ring oscillator may comprise 2N+1 inverters, where N is an integer of at least 1.

In another embodiment, the replica oscillator may be configured to start in response to an edge of a reference clock signal, and to stop in response to a second edge of the reference clock signal. The first and second edges may be the same or different (e.g., both can be positive [or rising], both can be negative [or falling], or one can be positive/rising and the other can be negative/falling). Alternatively, the circuit may further comprise a control circuit configured to produce one or more control signals in response to a reference clock signal, and the replica oscillator may be configured to start and stop in response to at least one of the control signals. Furthermore, the counting circuit may be further configured to reset, start, and stop in response to at least one of the control signals. In a still further embodiment, the compensation circuit may further configured to update the adjustment signal in response to at least one of the control signals.

Referring again to FIG. 3A, circuit 300 may include controller 320, which receives reference clock 311 and provides one or more control signals (e.g., control signals 321, 322, and/or 323, which may comprise one control signal or two or three different control signals) to replica oscillator 303, counter 340, and/or compensation circuit 350. It should be recognized that controller 320 may simply provide a reference clock (e.g., reference clock 311) to one or more circuit blocks (e.g., replica oscillator 303, counter 340, and/or compensation circuit 350) or may comprise a state machine (e.g., state machine 302 of FIG. 3B) containing logic configured to produce one or more control signals in response to the reference clock.

In yet another embodiment, the compensation circuit may comprise a current digital-to-analog converter (I-DAC), and the adjustment signal may comprise one or more bias currents. In a further embodiment, the variable oscillator may comprise a voltage controlled oscillator (VCO). Thus, in a still further embodiment, a frequency response of the VCO may depend at least in part on the bias currents produced by the I-DAC. Alternatively, the variable oscillator may comprise a current controlled oscillator.

Figure 3B:
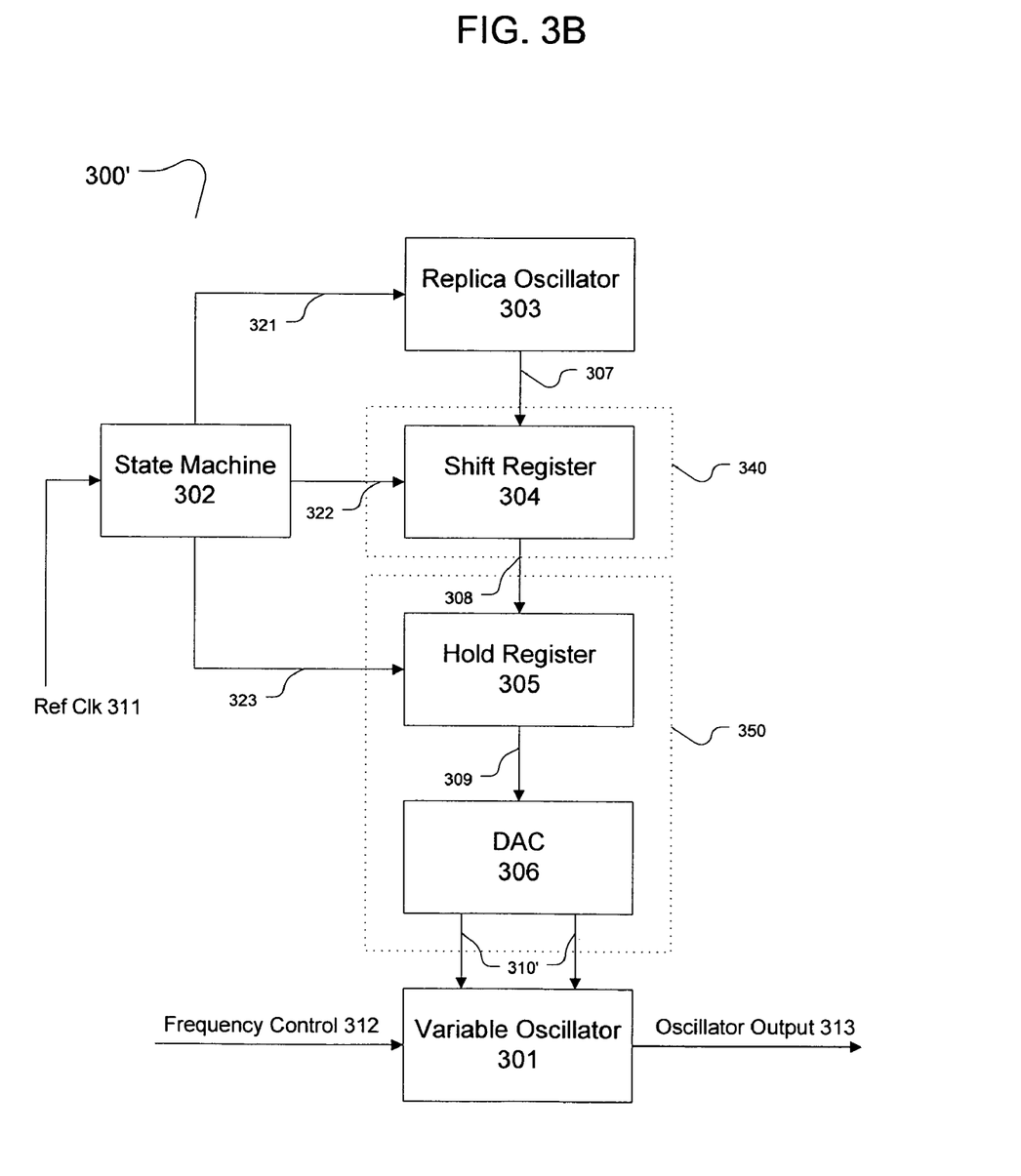

Referring now to FIG. 3B, an exemplary embodiment is shown. In circuit 300' variable frequency oscillator (VFO) 301 may receive adjustment signal 310' and frequency control signal 312. Frequency control signal 312 may generally comprise a variable voltage (for a voltage controlled oscillator [VCO]), a variable current (for a current controlled oscillator), or a numeric digital value (for a digital or numerically controlled oscillator [NCO]). In an exemplary embodiment, adjustment signal 310' may comprise a set of bias currents which have values generally proportional to process, voltage, and/or temperature variations. The overall effect of the combination of these variations is generally proportional (or otherwise related) to the speed of replica oscillator 303. This speed may be determined by use of a reference clock (e.g. reference clock 311) to determine a fixed time value. State machine 302 may cause replica oscillator 303 (which is preferably located on the same IC chip as variable oscillator 301) to run for one period of the reference clock (or for some known multiple and/or ratio of the reference clock).

Counter circuit 340 may comprise shift register 304. Each pulse or edge transition (e.g., rising edges and/or falling edges) of output 307 of replica oscillator 303 may shift a logical "1" into shift register 304. Compensation circuit 350 may comprise hold register 305 and digital-to-analog converter (DAC) 306. After one clock pulse or edge transition of reference clock signal 311, controller/state machine 302 may stop replica oscillator 303 and the value in shift register 304 may be transferred to hold register 305 via bus 308 for the count signal. The measurement (e.g., counting) process can then be repeated. Digital-to-analog converter (DAC) 306 may then convert the digital values in hold register 305 to analog levels to vary the frequency response of variable oscillator 301 (e.g., by converting the digital value to bias currents). Alternatively, when using a digital or numerically controlled oscillator (NCO) as the variable oscillator, the digital values of hold register 305 may be processed to adjust the frequency response of variable oscillator 301 (e.g., by calculating an adjusted digital control value for the NCO based on a digital frequency control signal 312 and the measured digital PVT. value [e.g., by adding, multiplying, or otherwise mathematically operating on one or both values, by performing a data lookup operation using one or both values, etc.]).

Figure 4:
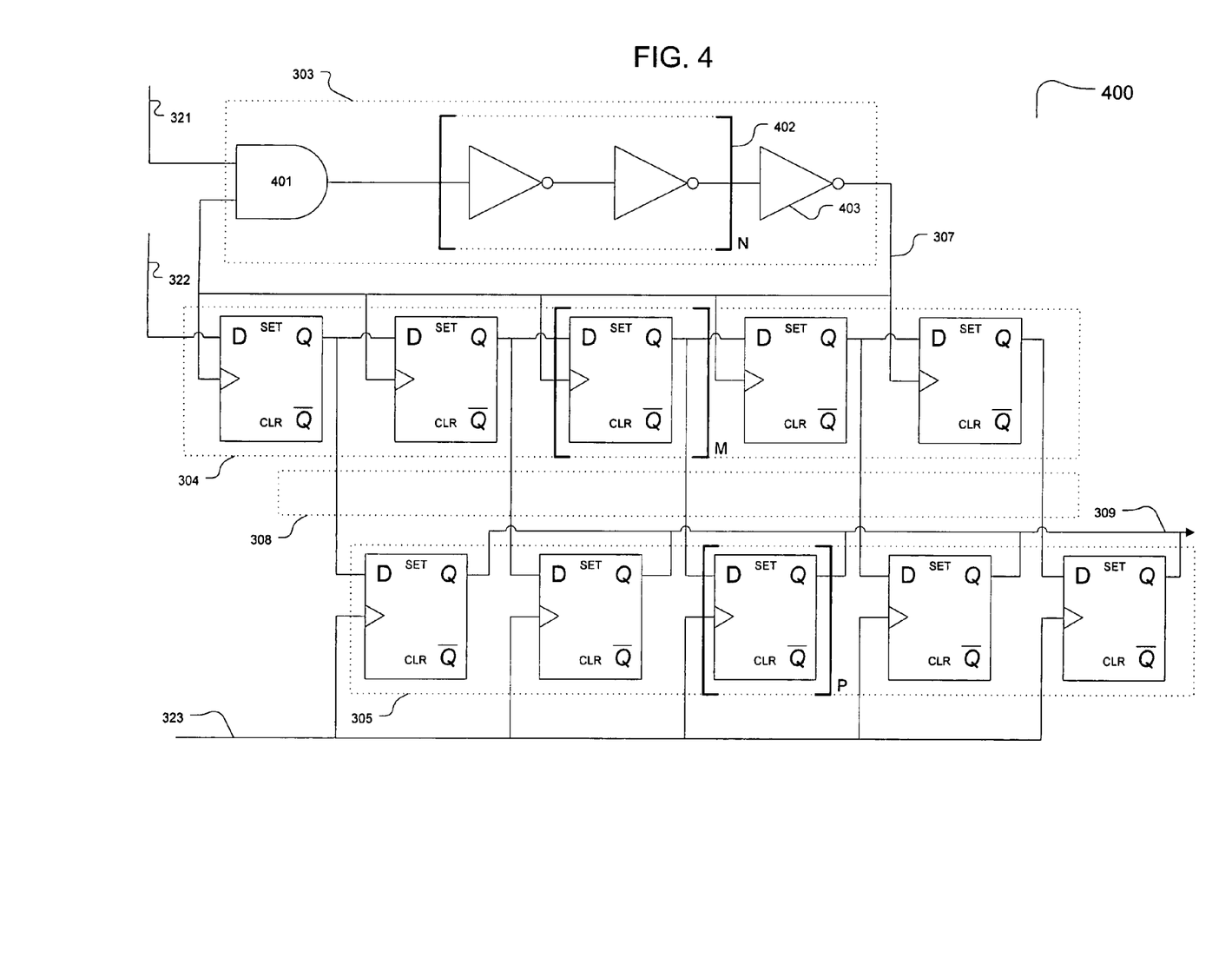
FIG. 4 is a diagram showing an exemplary process replica ring oscillator and associated counter and adjustment circuits according to the present invention.

FIG. 4 shows exemplary embodiments of replica oscillator 303, and associated shift register 304 and hold register 305. Replica oscillator 303 may comprise a ring oscillator and AND gate 401 to turn the oscillator on or off in response to control signal 321 (e.g., reference clock signal 311 or a control signal produced by controller 320 of FIG. 3A or state machine 302 of FIG. 3B in response to the reference clock signal). The output of AND gate 401 may be coupled to a chain of inverter circuits 402. Inverter chain 402 may comprise 2N inverters, where N is an integer of at least 1, and where N is sometimes as high as 10, 20, 25, or more. In one embodiment, the chain of inverter circuits 402 may comprise 50 inverters (e.g., N=25). The output of the chain of inverters may then pass through inverter 403 for an odd number of inversions, as is required for oscillation in many conventional ring oscillators. The output 307 of inverter 403 may then be coupled to the input of AND gate 401 to close the loop.

In a preferred embodiment, the total delay through inverter chain 401 should be approximately equal to half the period of the reference clock for optimal resolution of PVT. variations. The output of inverter 403 may produce replica oscillator signal 307, which generally comprises a square wave. Replica oscillator signal 307 may then clock shift register 304. Shift register 304 may be reset (e.g., set to all "0" values) by control signal 322 (e.g., reference clock signal 311 or a control signal produced by controller 320 of FIG. 3A or state machine 302 of FIG. 3B in response to the reference clock signal), prior to counting. Shift register 304 may comprise M flip-flops, where M is an integer. The number of flip-flips will generally depend on a desired and/or optimal resolution of PVT. variations. Referring again to FIG. 4, shift register 304 may comprise five flip-flops, although as few as three flip-flops can provide some minimum level of resolution.

A "1" may be shifted into the first stage of shift register 304 upon first rising or falling edge or positive or negative transition of signal 307, and the string of "1"s may propagate through the shift register with each pulse output from inverter 403. After one pulse shift register 304 may hold the value "10000." After two pulses shift register 304 may hold the value "11000" and so on for three, four, five, or more pulses. Such a result is conventionally known as a "thermometer code." Count signal 308 may thus comprise this thermometer coded value. Control signal 323 (e.g., reference clock signal 311 or a control signal produced by controller 320 of FIG. 3A or state machine 302 of FIG. 3B in response to the reference clock signal) may cause the thermometer coded measurement value to be transferred to hold register 305 after the completion of the measurement interval. Hold register 305 generally comprises the same number (e.g. M) of flip-flops as shift register 304. Referring again to FIG. 4, shift register 305 may comprise five flip-flops. The value in hold register 305 may provide signal 309 (e.g., comprising a 5-bit parallel output) to a bias generator circuit (e.g., DAC 306 of FIG. 3B).

Figure 5:
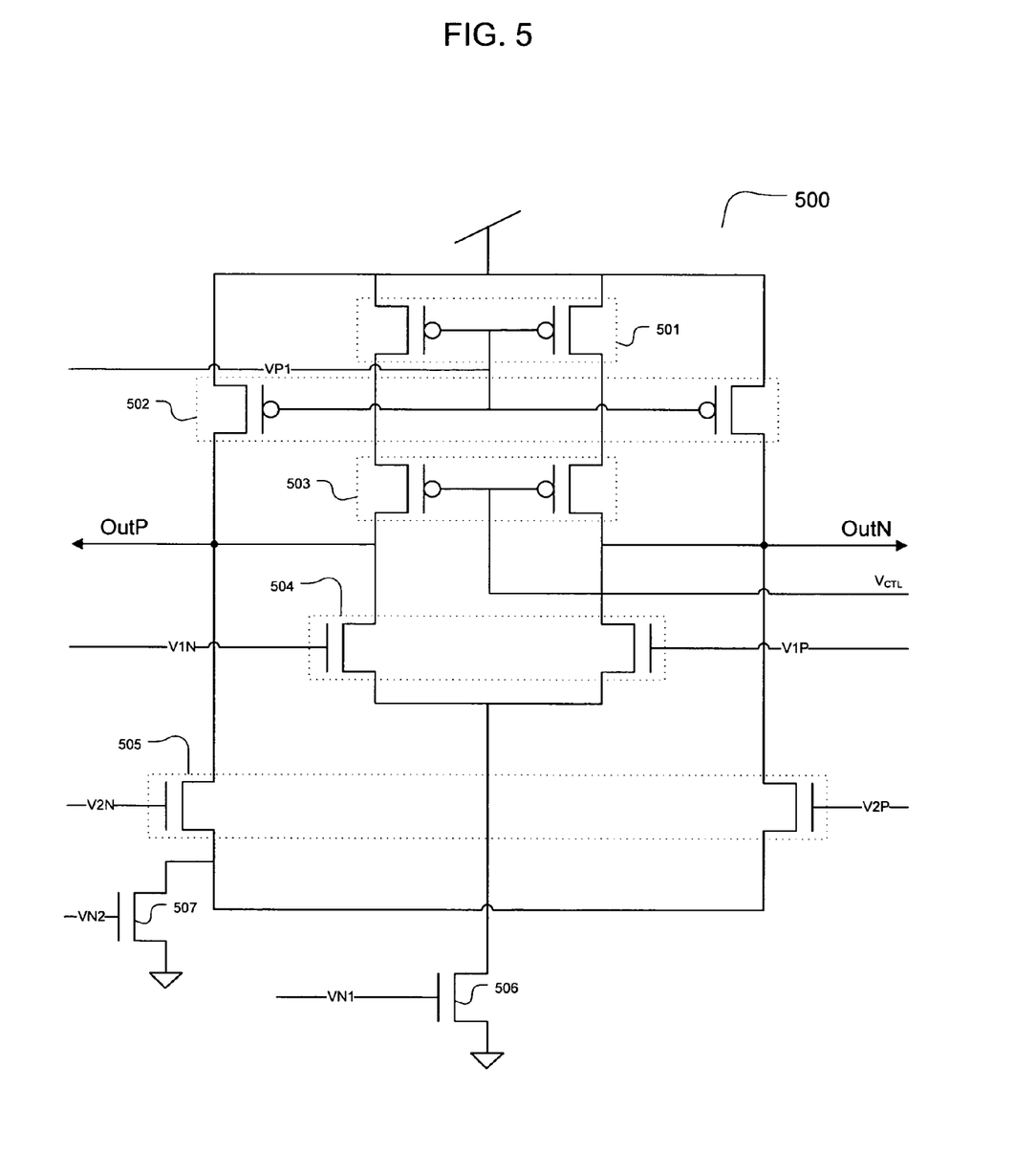
FIG. 5 is a diagram showing an exemplary delay stage for a high speed variable oscillator according to the present invention.

In a preferred embodiment, the high frequency variable oscillator (e.g., variable oscillator 301 of FIGS. 3A/B) should include logic or circuitry by which the frequency response may be adjusted to compensate for PVT. values. Referring now to FIG. 5, an exemplary differential current mode buffer 500 used as delay stage (e.g., delay stage 606, 607, 608, or 609 of variable oscillator 600 of FIG. 6) for a voltage controlled oscillator (VCO) is shown. Buffer 500 operates on a principle of controlling the current available to charge the various parasitic capacitances of the circuit. Generally, the more current available, the faster the buffer will charge and discharge the parasitic capacitances and the faster the VCO will oscillate. The buffer may comprise four current bias controls, and generates output signals OutN and OutP.

Transistor pair 501 generally sets the current through transistor pair 503. Thus, transistor pair 501 may set the overall current available to the VCTL input (e.g., frequency control signal 312 comprising a control voltage for the VCO). Transistor pair 502 generally provides a minimum or mirror current which is not dependent on the value of VCTL. This generally allows VCTL to go high enough to shut off transistor pair 503 without stopping oscillation. The total current available is thus the sum of the current through transistor pair 501 and transistor pair 502, and is generally controlled by bias input voltage value VP1. This source current may be sunk through transistors 506 and 507 under control of bias voltages VN1 and VN2, respectively. Buffer 500 may have two differential signal inputs V1 (e.g., signals V1N and V1P) coupled to transistor pair 504 and V2 (e.g., signals V2N and V2P) coupled through transistor pair 505. The usage of these signal inputs will be discussed with regard to FIG. 6, below.

Figure 6:
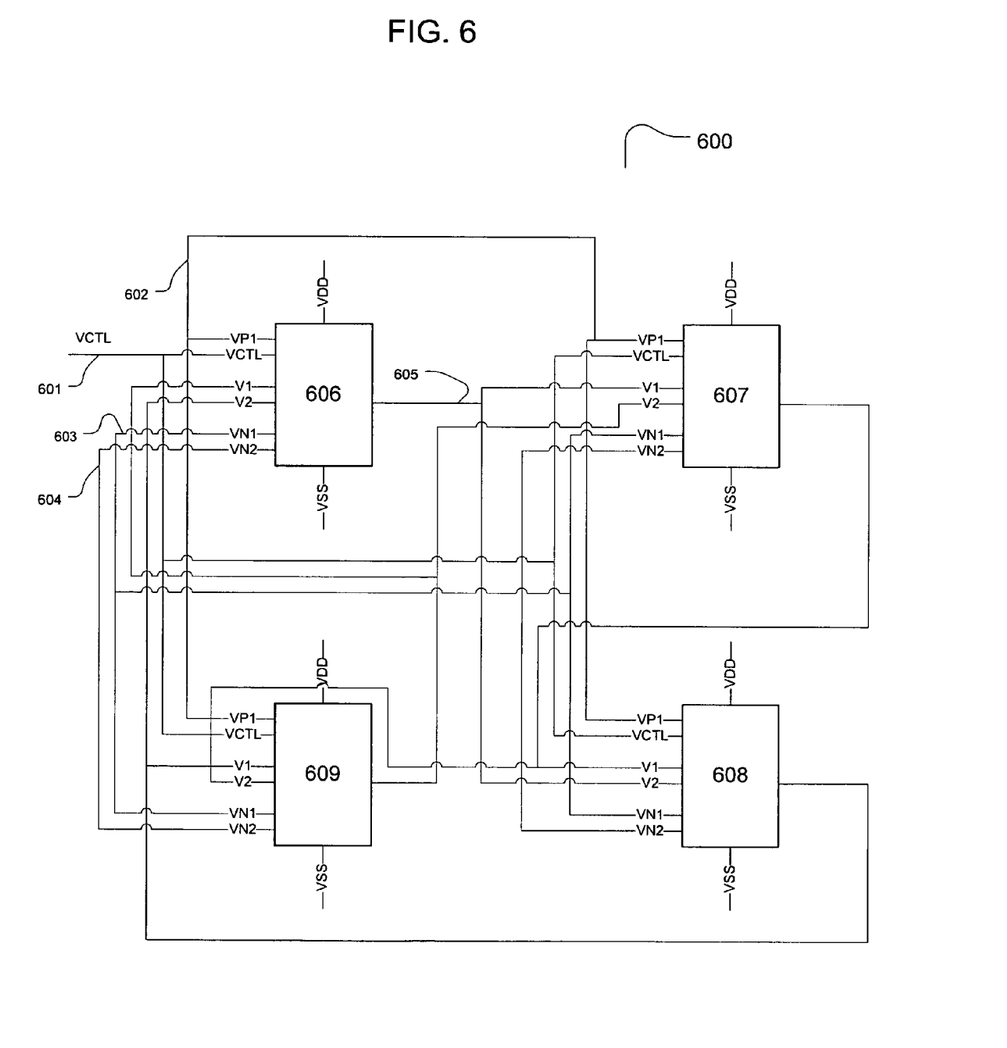
FIG. 6 is a diagram of connections for a four stage high speed variable oscillator according to the present invention.

Referring now to FIG. 6, the overall interconnection of an exemplary VCO (e.g., variable oscillator 301 of FIGS. 3A/B) is shown. The interconnections of differential stages 606, 607, 608, and 609 (where each may comprise, e.g., buffer stage 500 of FIG. 5) are shown in the figure as single interconnects but the connections of differential pairs are easily understood by a person skilled in the art. The like external bias inputs of each stage are connected (e.g., each VN1 input is coupled to line 603, each VN2 input is coupled to line 604, each VP1 input is coupled to line 602, and each VCTL input is coupled to line 601). These connections may then be coupled to the outputs of the bias generator (e.g., DAC 306 of FIG. 3B). The signal outputs may be understood with reference to signal 605. Signal 605 is generally the output of buffer stage 606 and is coupled to buffer 607 input V1. It is also coupled to buffer 608 input V2 in a feed-forward ring oscillator configuration. This feed-forward or "skip around" configuration is known in the art as a means of increasing the oscillation frequency of a ring oscillator. This configuration may be used here to increase the center frequency of the oscillator (e.g., to compensate for a "slow" process corner). The output connections of the other three stages are generally similar to that of stage 606. As is well understood in the art, the connection of one stage (e.g., stage 609) should have the differential signal pairs reversed in order to sustain oscillation.

Figure 7:
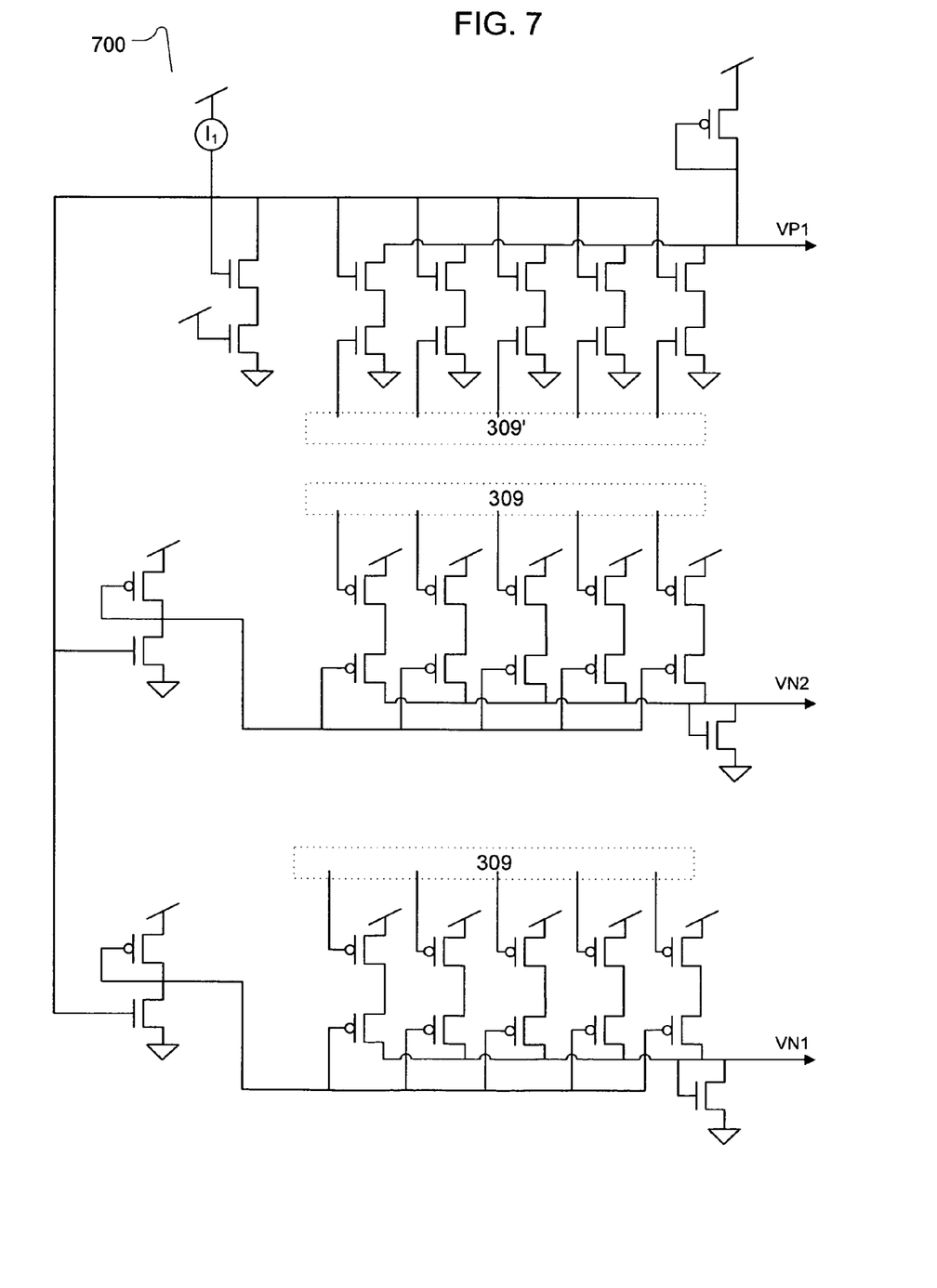
FIG. 7 is a diagram showing an exemplary bias setpoint circuit for translating measured process variations into bias currents according to the present invention.

Referring now to FIG. 7, exemplary bias generator 700 is shown. Bias generator 700 generally converts a thermometer coded measurement value (e.g., five-bit parallel output 309 of hold register 305 of FIG. 4, and/or 5-bit complement output 309') to a set of voltages VP1, VN1, and VN2 using a set of CMOS current mirrors in order to cause the correct bias currents in the delay stages of a VCO. A known current I1 may be fed into a set of three current mirrors. The output of each drive mirrors five transistors, which are scaled to give the appropriate current values. Depending on the value of the corresponding bit of the 5-bit measurement (e.g., the five output values of the five flip flops of hold register 305), the current output of each mirror may be added (or not added) to a current sum value. The resulting sum may be coupled through a scaled mirror transistor to generate an output voltage. It is within the capabilities of a person skilled in the art to scale the size of each transistor to achieve the desired shift in VCO gain characteristics desired.

In an alternate embodiment, the variable oscillator may comprise a numerically controlled oscillator. In a further embodiment the adjustment signal may comprise a digital value, thus removing some or all analog control.

An Exemplary Method

The present invention further relates to method for compensating a variable oscillator for process and/or operational variations. The method generally comprises the steps of (a) counting the number of pulses of a replica oscillator signal, and (b) providing an adjustment signal to the variable oscillator in accordance with the number of pulses counted. In a preferred embodiment, the producing step may occur on the same integrated circuit chip that the variable oscillator occupies.

In another embodiment, the method may comprise producing the replica oscillator signal in response to a reference clock signal. Alternatively, the method may comprise the step of producing one or more control signals in response to a reference clock signal. Thus, in a further embodiment the method may comprise activating the producing step in response to at least one of the control signals. In another embodiment, the method may include resetting the count signal in response to at least one of the control signals. In a further embodiment, the method may comprise stopping the counting step in response to at least one of the control signals. In yet another embodiment, the method may include updating the adjustment signal in response to at least one of the control signals.

In another embodiment, the providing step may comprise converting the count signal to one or more bias currents, and the adjustment signal may comprise the one or more bias currents. In one specific implementation, the method may producing an oscillator output from the VCO, where a frequency of the oscillator output depends in part on the one or more bias currents and depends in part on a voltage control signal. In an alternative embodiment, the variable oscillator may comprise a current controlled oscillator. Finally, the variable oscillator may comprise a numerically (digitally) controlled oscillator. Thus, the adjustment signal may comprise a digital value.

Figure 8:
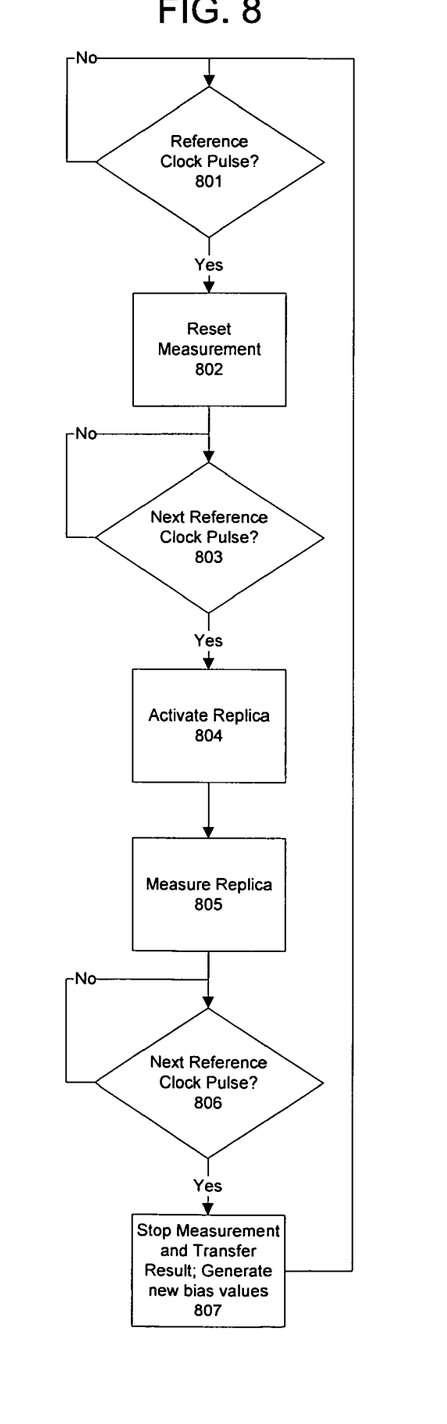
FIG. 8 is a flow chart of an exemplary method according to the present invention.

Referring now to FIG. 8, a flowchart of an exemplary method according to the present invention is shown. At the first reference clock pulse (step 801) the shift register contents from the previous measurement is set to zero (step 802). At the next clock (step 803), the measurement may be started. Thus, the replica oscillator (e.g. replica oscillator 303 of FIG. 3B) may be activated (step 804) and the shift register (e.g., shift register 304 of FIG. 3B) may be allowed to shift (step 805). At the next clock (step 806), the oscillator may be stopped and the thermometer coded measurement result may be transferred to the hold register (e.g., hold register 305 of FIG. 3B). The bias generator (e.g., DAC 306 of FIG. 3B) may then set new bias values based on the new contents of the hold register (step 807). The process may then repeat continuously to compensate for continuing operational changes.

CONCLUSION/SUMMARY

Thus, the present invention provides a circuit and method for compensating a variable oscillator for process and/or operational variations by measuring a frequency output of a replica oscillator and adjusting the frequency response of a variable oscillator in response to the measurement.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit comprising:
   a) a replica oscillator;
   b) a counter configured to count pulses of said replica oscillator and to produce a count signal; and
   c) a compensation circuit configured to provide an adjustment signal to a variable oscillator in accordance with said count signal;
   d) a control circuit configured to produce one or more control signals in response to a reference clock signal;
   wherein said counter is further configured to reset, start and stop in response to at least one of said control signals.

2. An integrated circuit chip comprising the circuit of claim 1, and said variable oscillator.

3. The circuit of claim 1, wherein said replica oscillator comprises a ring oscillator comprising 2N+1 inverters, where N is an integer of at least 1.

4. A circuit comprising:
   a) a replica oscillator;
   b) a counter configured to count pulses of said replica oscillator and to produce a count signal; and
   c) a compensation circuit configured to provide an adjustment signal to a variable oscillator in accordance with said count signal;
   wherein said replica oscillator is configured to start in response to a first edge of a reference clock signal, and to stop in response to a second edge of said reference clock signal.

5. A circuit comprising:
   a) a replica oscillator:
   b) a counter configured to count pulses of said replica oscillator and to produce a count signal;
   c) a compensation circuit configured to provide an adjustment signal to a variable oscillator in accordance with said count signal; and
   d) a control circuit configured to produce one or more control signals in response to a reference clock signal;
   wherein said replica oscillator is configured to start and stop in response to at least one of said control signals.

6. The circuit of claim 1, wherein said compensation circuit is further configured to update said adjustment signal in response to at least one of said control signals.

7. The circuit of claim 1, wherein said compensation circuit comprises a current digital-to-analog converter (I-DAC), and said adjustment signal comprises one or more bias currents.

8. The circuit of claim 7, wherein said variable oscillator comprises a voltage controlled oscillator (VCO) or a current controlled oscillator.

9. The circuit of claim 8, wherein a frequency response of said VCO depends at least in part on said one or more bias currents.

10. The circuit of claim 1, wherein said variable oscillator comprises a numerically controlled oscillator, and wherein said adjustment signal comprises a digital value.

11. A method of compensating a variable oscillator for process and/or operational variations, comprising the steps of:
   a) counting the number of pulses of a replica oscillator signal and generating a count signal;

b) providing an adjustment signal to said variable oscillator in accordance with said number of pulses;

c) producing one or more control signals in response to a reference clock signal, and producing said replica oscillator signal in response to at least one of said control signals; and d) updating said adjustment signal in response to at least one of said control signals.

12. The method of claim 11, further comprising producing said replica oscillator signal in response to a reference clock signal.

13. A method of compensating a variable oscillator for process and/or operational variations, comprising the steps of:

a) counting the number of pulses of a replica oscillator signal and generating a count signal;

b) providing an adjustment signal to said variable oscillator in accordance with said number of pulses;

c) producing one or more control signals in response to a reference clock signal, and producing said replica oscillator signal in response to at least one of said control signals; and d) resetting said count signal in response to said at least one of control signals.

14. The method of claim 13, further comprising stopping said counting in response to at least one of said control signals.

15. The method of claim 11, wherein said providing step comprises converting said count signal to one or more bias currents, and said adjustment signal comprises said one or more bias currents.

16. The method of claim 15, wherein said variable oscillator comprises a voltage controlled oscillator (VCO) or a current controlled oscillator.

17. The method of claim 16, further comprising producing an oscillator output from said VCO, wherein a frequency of said oscillator output depends in part on said one or more bias currents and depends in part on a voltage control signal.

18. The method of claim 11, wherein said variable oscillator comprises a numerically controlled oscillator, and wherein said adjustment signal comprises a digital value.

* * * * *